(12) United States Patent
Pahl et al.

(10) Patent No.: US 11,257,771 B2
(45) Date of Patent: Feb. 22, 2022

(54) HIGH-PERFORMANCE INTEGRATED CIRCUIT PACKAGING PLATFORM COMPATIBLE WITH SURFACE MOUNT ASSEMBLY

(71) Applicant: Keysight Technologies, Inc., Santa Rosa, CA (US)

(72) Inventors: Philipp Pahl, Santa Rosa, CA (US); Colin March, Santa Rosa, CA (US); John Westerman, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 112 days.

(21) Appl. No.: 16/724,473

(22) Filed: Dec. 23, 2019

(65) Prior Publication Data
US 2021/0193599 A1 Jun. 24, 2021

Related U.S. Application Data

(60) Provisional application No. 62/787,726, filed on Jan. 2, 2019.

(51) Int. Cl.
| | |
|---|---|
| *H01L 23/66* | (2006.01) |
| *H01L 23/00* | (2006.01) |
| *H01L 23/498* | (2006.01) |
| *H01P 3/06* | (2006.01) |

(52) U.S. Cl.
CPC ........ *H01L 23/66* (2013.01); *H01L 23/49838* (2013.01); *H01L 23/564* (2013.01); *H01L 24/48* (2013.01); *H01P 3/06* (2013.01); *H01L 2223/6627* (2013.01); *H01L 2224/48227* (2013.01); *H01L 2924/30111* (2013.01)

(58) Field of Classification Search
CPC . H01L 23/66; H01L 23/49838; H01L 23/564; H01L 24/48; H01L 2223/6627; H01L 2224/48227; H01L 2924/30111; H01P 3/06
See application file for complete search history.

(56) References Cited

U.S. PATENT DOCUMENTS

| | | | | |
|---|---|---|---|---|
| 4,626,805 A | * | 12/1986 | Jones | ....................... H01L 23/66 |
| | | | | 333/246 |
| 7,245,007 B1 | * | 7/2007 | Foster | ............... H01L 23/49527 |
| | | | | 257/666 |
| 7,294,904 B1 | * | 11/2007 | Chee | ....................... H01L 23/66 |
| | | | | 257/528 |

(Continued)

*Primary Examiner* — Shaun M Campbell

(57) ABSTRACT

An integrated circuit package includes a transmission line structure, conductive bonds, a post and a dielectric post. The transmission line structure runs from a printed circuit board (PCB) to an integrated circuit (IC) and includes a center transmission line surrounded by ground and sealed from exposure to air. The conductive bonds connect the transmission line structure to pads on the integrated circuit from where the center transmission line exits the integrated circuit package. The first post is part of the center transmission line where the center transmission line enters the integrated circuit package from the printed circuit board. The dielectric post supports the center transmission line where the center transmission line exits the integrated circuit package to connect to the conductive bonds and compensates part of the conductive bond inductance.

17 Claims, 8 Drawing Sheets

(56) References Cited

U.S. PATENT DOCUMENTS

| | | | |
|---|---|---|---|
| 7,745,911 B2 | 6/2010 | Lee et al. | |
| 9,306,255 B1 * | 4/2016 | Rollin | H01P 5/107 |
| 2001/0048155 A1 * | 12/2001 | Budka | H01L 23/66 |
| | | | 257/727 |
| 2002/0106835 A1 * | 8/2002 | Carter | H01L 23/66 |
| | | | 438/123 |
| 2008/0246562 A1 * | 10/2008 | Sherrer | H01P 11/005 |
| | | | 333/260 |
| 2019/0019776 A1 | 1/2019 | Tuncer et al. | |

* cited by examiner

HIGH-PERFORMANCE INTEGRATED CIRCUIT PACKAGING PLATFORM COMPATIBLE WITH SURFACE MOUNT ASSEMBLY

CROSS REFERENCE TO RELATED APPLICATIONS

The present application claims priority under 35 U.S.C. § 119(e) to U.S. Provisional Application No. 62/787,726, naming Philipp Pahl, et al. inventors, and filed on Jan. 2, 2019. The entire disclosure of U.S. Provisional Application No. 62/787,726 is hereby specifically incorporated by reference in its entirety.

BACKGROUND

An integrated circuit (IC) is an electronic circuit formed on a semiconductor. Surface-mount technology (SMT) involves the production of electronic circuits by mounting or placing components such as integrated circuits directly onto the surface of printed circuit boards (PCBs). Integrated circuit packages are structures used to physically and electrically connect integrated circuits to printed circuit boards. Quad flat no-lead (QFN) packages are a popular form of SMT integrated circuit package for mounting or placing an integrated circuit onto the surface of a PCB. Known QFN packages include a series of leads, which typically have uniform cross sections, and which are made by encapsulating a frame in an epoxy material to provide isolation between the leads. Several varieties of standardized QFN packages are commercially available with various configurations. Known QFN packages may encapsulate the integrated circuit in a molding package, though some so-called air cavity QFN packages place the integrated circuit in an air cavity immediately around the integrated circuit. Use of known QFN packages including the air cavity QFN packages may impose frequency limits, as detailed below.

FIG. 1 is a bonding diagram illustrating connectivity between pads on an integrated circuit and the leads of a known QFN package. An integrated circuit 199 is placed in the QFN package 100 and wirebonds 130 are used to make connections between pads 199a on the integrated circuit 199 and leads 101 in the QFN package 100. In FIG. 1, leads 101 are labelled on three sides as 1 to 8, 9 to 16, and 17 to 24 respectively.

Known integrated circuit packages such as the QFN package 100 in FIG. 1 can deliver acceptable performance up to about 40 GHz in current designs but performance is generally limited at frequencies above 40 GHz due, for example, to impedance mismatch. It becomes difficult to maintain a consistent impedance (e.g., 50 Ohms) in the signal path due, for example, to the QFN package 100, the connections between the QFN package 100 and the PCB, and the connections between the QFN package 100 and the integrated circuit 199, and this becomes increasingly problematic at higher frequencies.

The problems arising from the connections result, for example, from the mechanical structure of the leads 101 connecting the QFN package to the integrated circuit, and the bonds used to attach the QFN package to a PCB. The mechanical structure of the leads 101 connecting to the integrated circuit 199 becomes problematic at high frequencies due, for example, to overmolding technology used to encapsulate the leads 101. Additionally, the electrical characteristics of the wirebonds connecting the leads 101 with the IC bond pads 199a detune the electrical impedance. Other problems with the connections include the (large) size of the PCB bond pad required in the assembly process for QFN packages, as this may cause a parasitic effect.

Other problems encountered using known QFN packages at high frequencies include that several such packages rely on potting of the integrated circuit and wirebonds to meet environmental operating requirements of various standards such as those imposed by the JEDEC Solid State Technology Association. At high operating frequencies potting is undesirable as dielectric characteristics of the potting material can degrade performance of the integrated circuit package.

Accordingly, even when some of the structures and manufacturing techniques described above are used, mechanisms for compensating for parasitic and other effects are needed to allow for effective performance for today's high-frequency applications.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
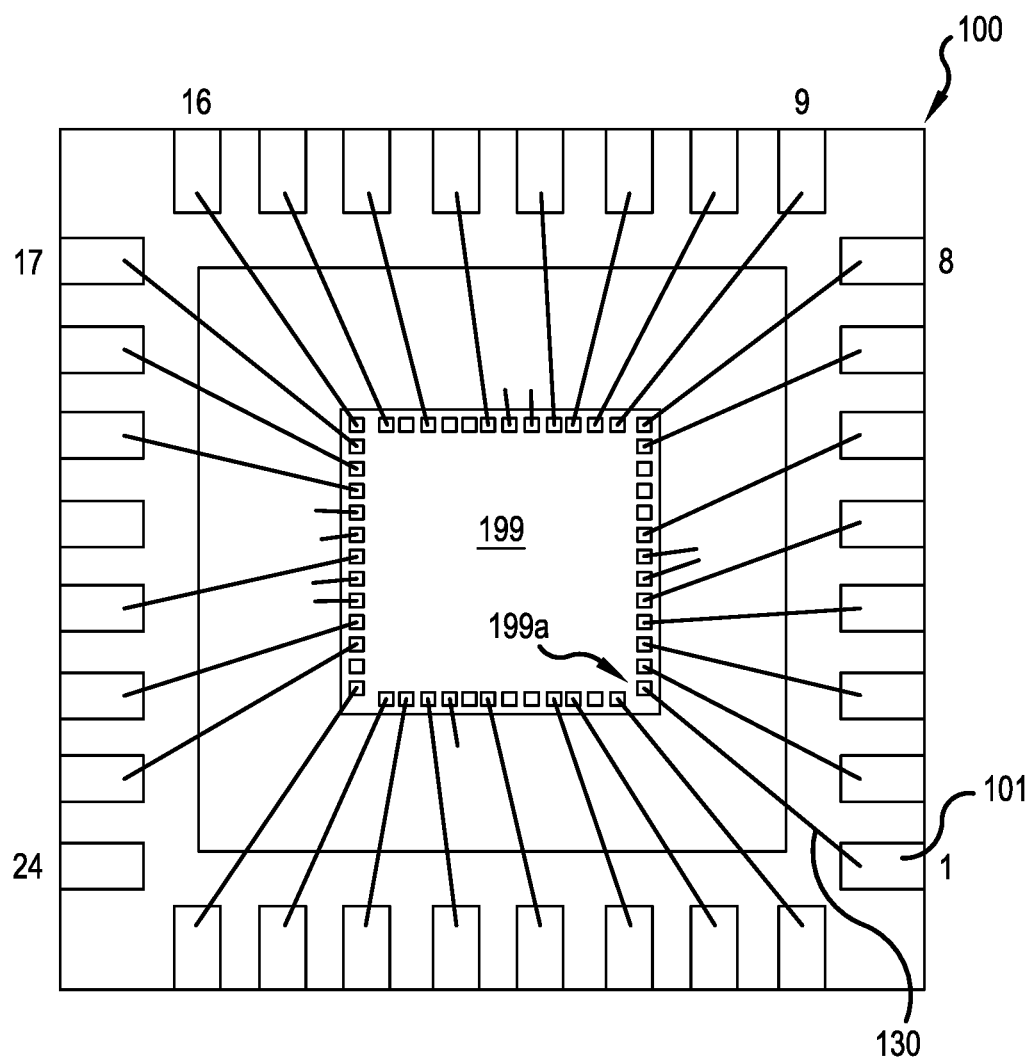
FIG. 1 is a bonding diagram illustrating connectivity between pads on an integrated circuit and the leads of a known QFN package.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting.

The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, as used herein when a first element is "adjacent" to a second element, the first element is abutting the second element, or there are one or more layers, materials, structures, etc., between the first and second elements.

Unless otherwise noted, when an element or component is said to be "connected to", or "coupled to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the benefits as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to aspects of the present disclosure, a controlled electrical impedance path can be provided inside of an integrated circuit package from the PCB to the integrated circuit. The controlled electrical impedance path may be implemented with features on the PCB, the integrated circuit as well as inside the integrated circuit package in order to optimize performance of the transition from the PCB to the integrated circuit.

As described below, an integrated circuit package may provide a transmission line structure running from a PCB to an integrated circuit. The integrated circuit package described herein may be a surface mount packaging technology with a controlled electrical impedance, may provide compensation for the non-ideal properties of the bond pads of the integrated circuit and bond wires connecting the integrated circuit package with the integrated circuit, and the bond pads of the PCB connecting the PCB to the integrated circuit package. The transmission line structure may provide for effective electrical impedance matching throughout, which can be a key factor for high frequency performance. The integrated circuit package may provide compensation for capacitances and inductances in the transition from the PCB to the integrated circuit, to maintain the electrical impedance at a selected level such as 50 Ohms. In this way, elements in the integrated circuit package that add unwanted capacitance or inductance can be compensated so that the electrical impedance in the signal path is maintained very close to a desired electrical impedance (e.g. that of the RF ports of the integrated circuit). The wirebonds described below in relation to embodiments replace the wirebonds of the known QFN packages as in FIG. 1 and may either have electrical impedances selected to be close or equal to the electrical impedance of the integrated circuits packaged in the integrated circuit packages or are compensated by capacitance on the integrated circuit and/or the integrated circuit package described herein.

Figure 2A:
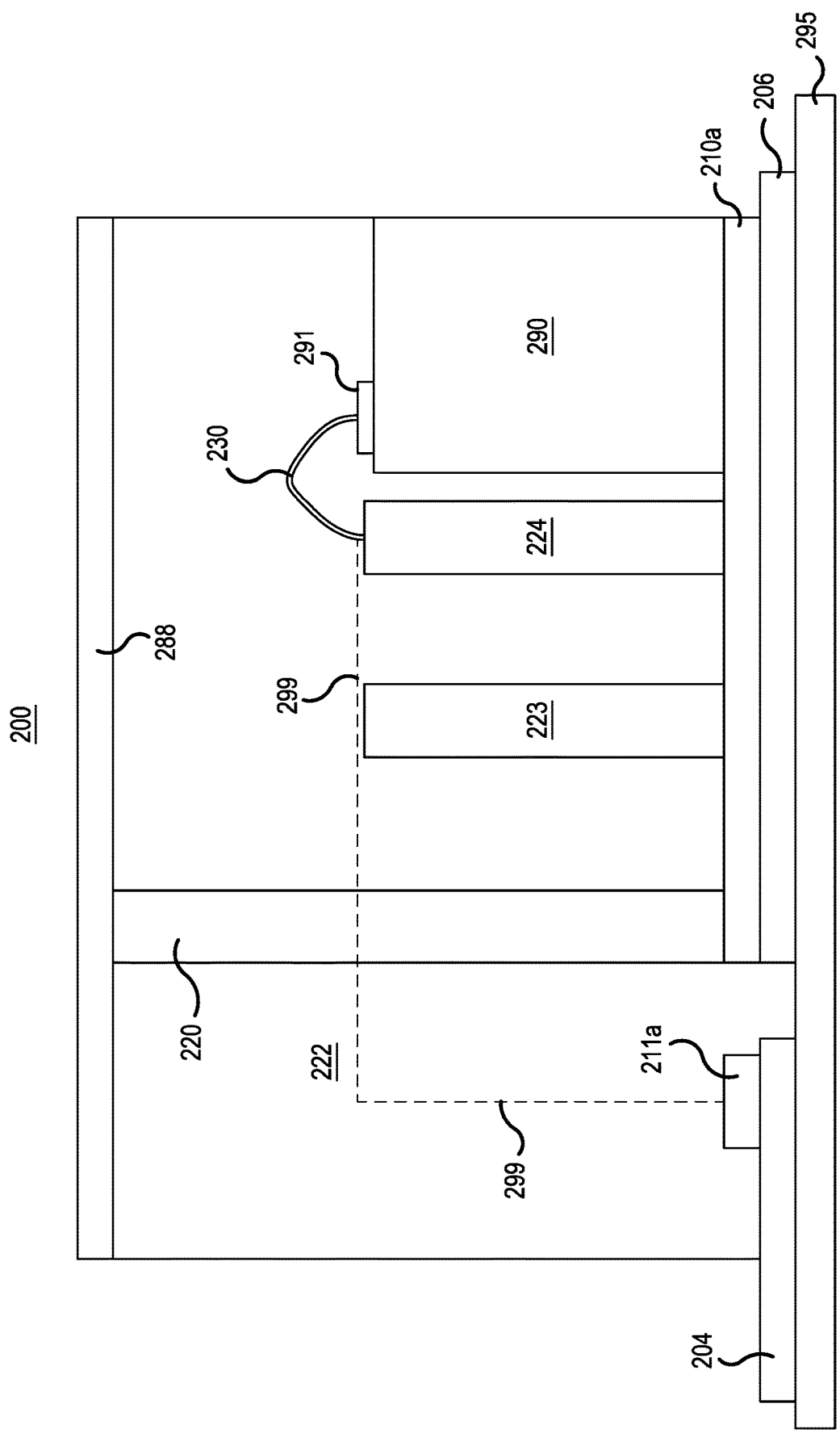
FIG. 2A illustrates a simplified block diagram of an integrated circuit package transition, according to representative embodiments.
Figure 2B:
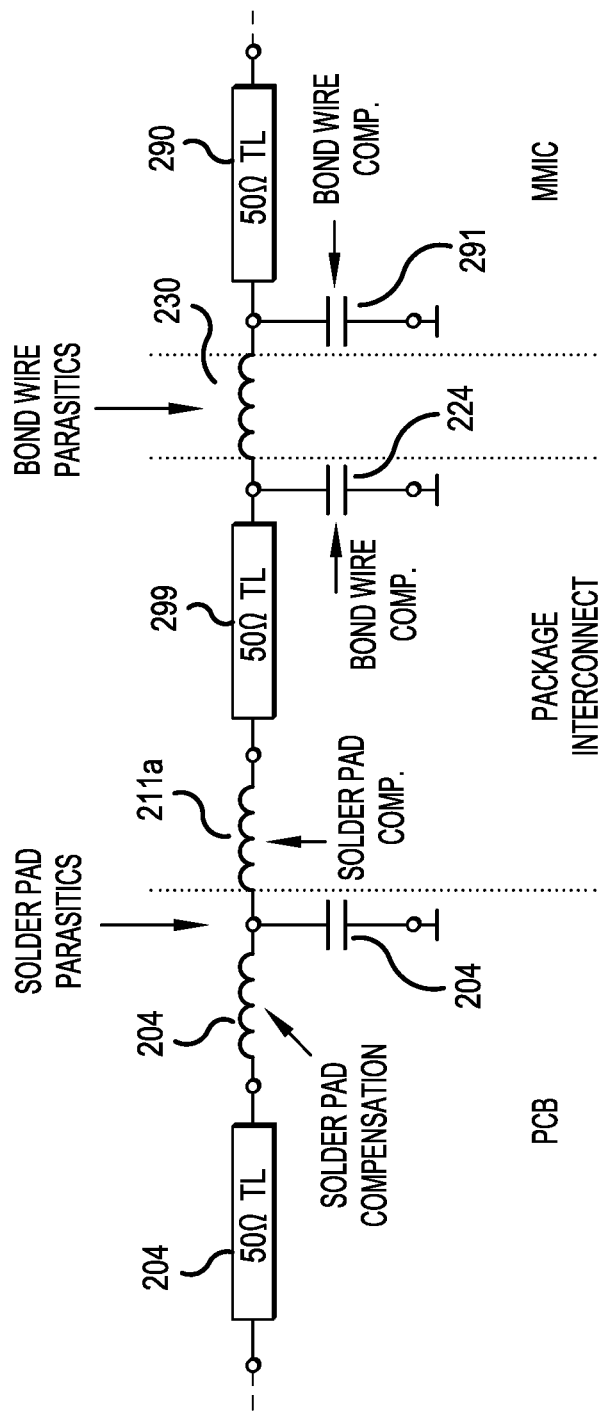
FIG. 2B is an equivalent electrical circuit diagram of an integrated circuit package transition between two signal transmission lines according to representative embodiments.
Figure 2C:
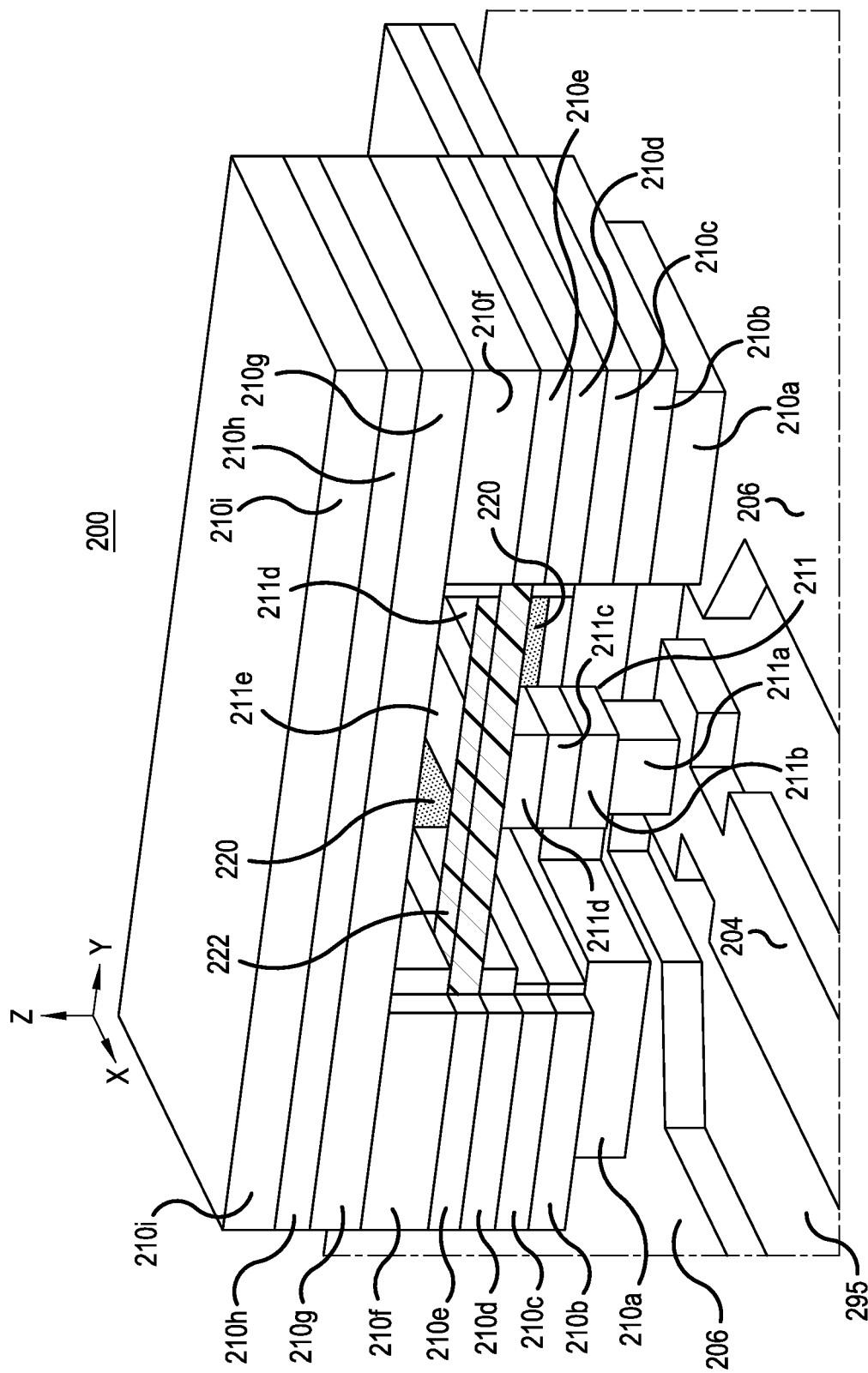
FIG. 2C illustrates a front perspective view of the integrated circuit package transition in FIG. 2A, according to representative embodiments.
Figure 2D:
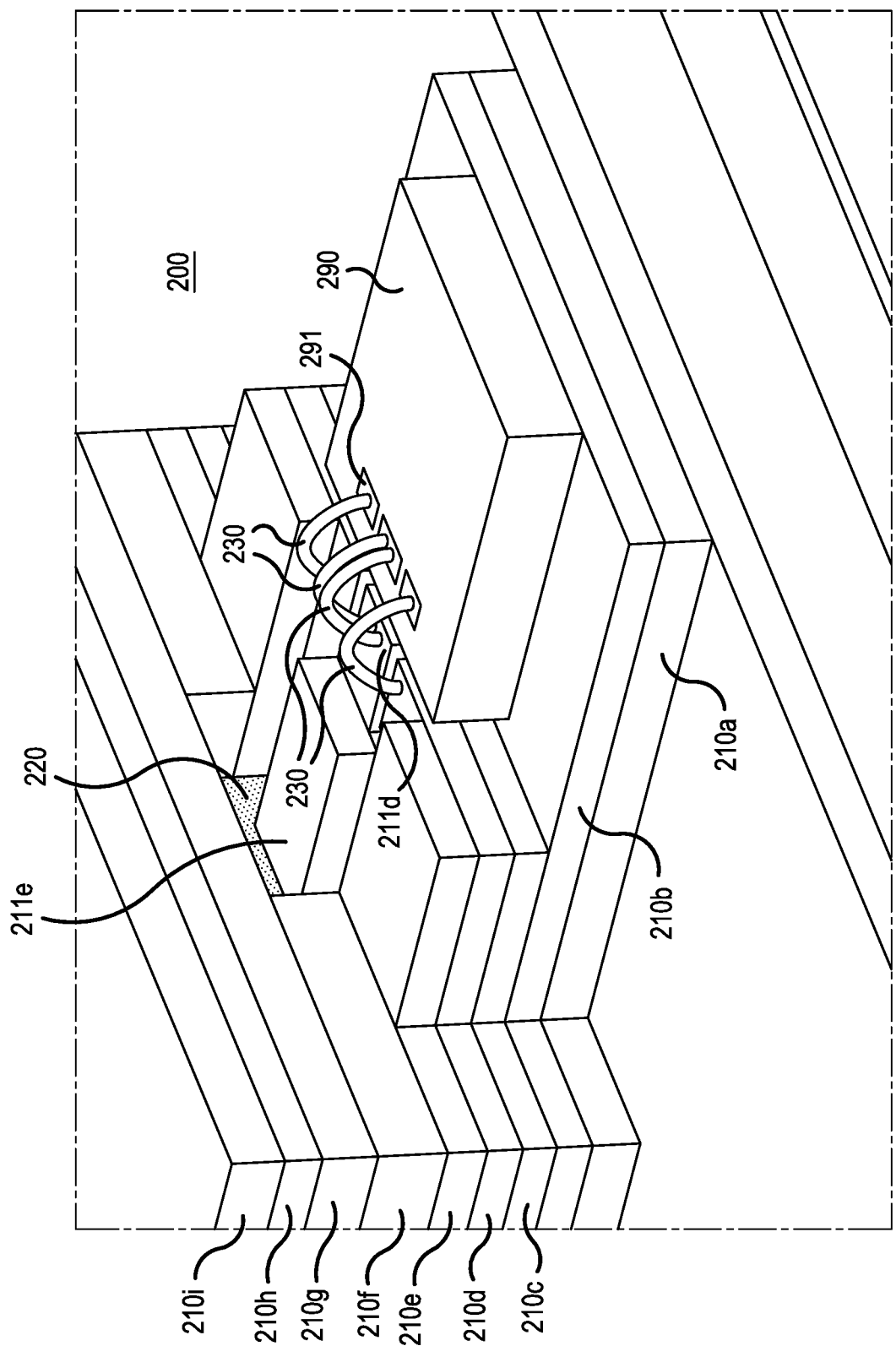
FIG. 2D illustrates a rear perspective view of the integrated circuit package transition in FIGS. 2A and 2C, according to a representative embodiment.
Figure 2E:
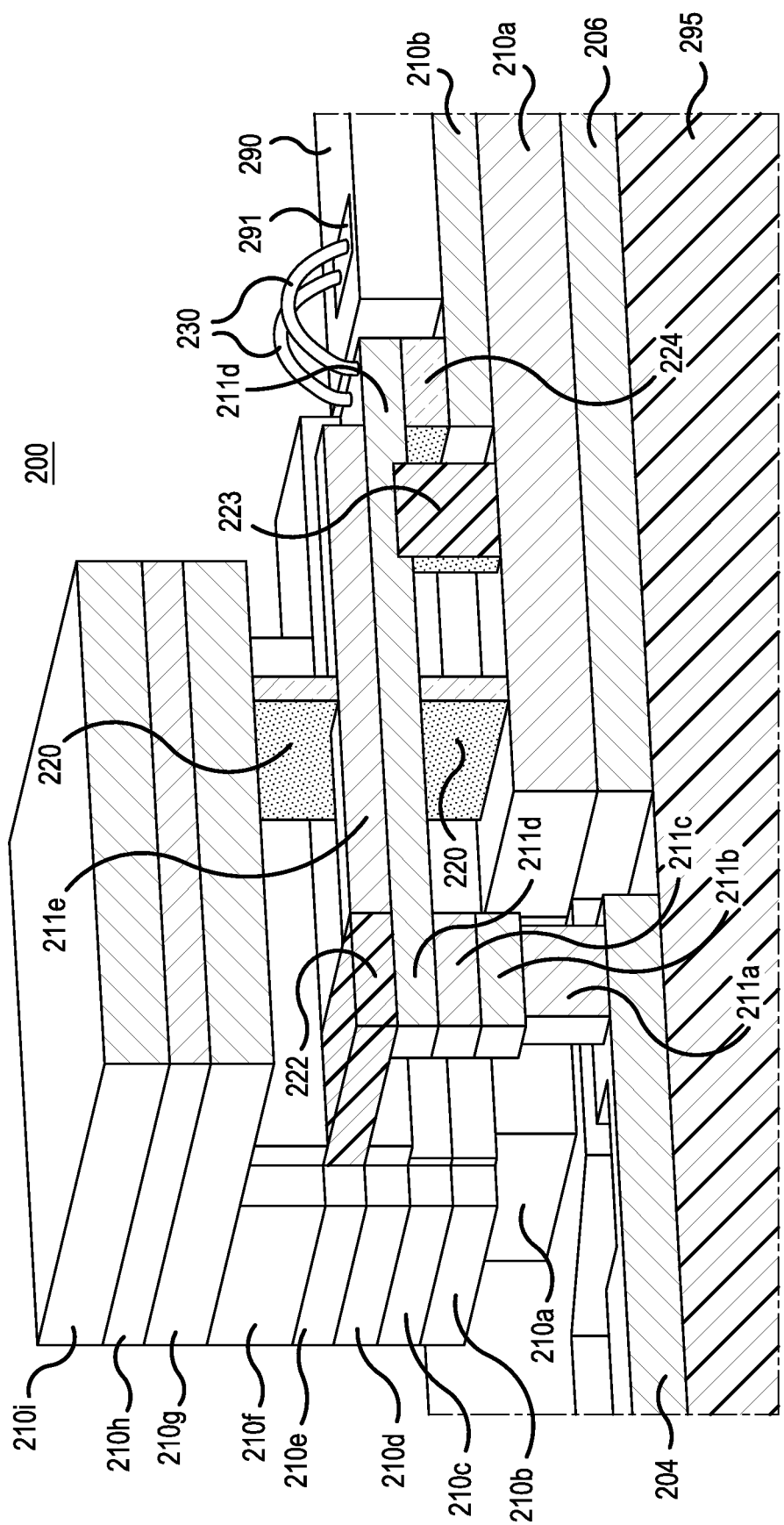
FIG. 2E illustrates a cross-section view of the integrated circuit package transition in FIGS. 2A, 2C and 2D, according to a representative embodiment.

A first embodiment of the present disclosure is illustrated in FIGS. 2A to 2E and explained below. In the first embodiment, FIG. 2A illustrates an integrated circuit package as a block diagram, FIG. 2B is an equivalent electrical circuit diagram of an integrated circuit package transition between the PCB and the IC represented by two signal transmission lines according to representative embodiments, and FIGS. 2C, 2D and 2E illustrate the integrated circuit package from different perspective views.

FIG. 2A illustrates a simplified block diagram of an integrated circuit package, according to representative embodiments.

In FIG. 2A, the integrated circuit package 200 includes a center transmission line 299 of a signal transmission structure supported by a dielectric strap 222, a first dielectric post 223, a second dielectric post 224 and running through a dielectric wall 220. The center transmission line 299 terminates at wire bonds 230, and the wire bonds 230 connect the center transmission line 299 to the RF bond pads 291 of the integrated circuit 290. Notably, the use of wire bonds 230 is merely illustrative, and other types of electrical connections suitable for use to effect the connections made by wire bonds 230 are contemplated. More generally, the electrical connections connecting the center transmission line 299 to the RF bond pads 291, including wire bonds 230 or other suitable electrical connections, are referred to herein as conductive bonds.

The integrated circuit package 200 is sealed by a lid 288. A lowest layer 211*a* (also referred to as first layer 211*a*) of the integrated circuit package 200 is supported on PCB center conductor 204, and a lowest layer 210*a* (also referred to as first layer 210*a*) of the integrated circuit package 200 is supported on PCB ground conductor 206. The center transmission line 299 is shown as a signal transmission line that runs from the PCB center conductor 204 past the dielectric strap 222, through the dielectric wall 220, on top of the first dielectric post 223 and second dielectric post 224 and up to wire bonds 230. The center transmission line 299 is representative of high frequency transmission lines that communicate using frequencies approaching and exceeding 100 GHz. The center transmission line 299 is supported by the dielectric strap 222, the dielectric wall 220, the first dielectric post 223 and second dielectric post 224 in the interior of the integrated circuit package 200. In the embodiment of FIGS. 2A to 2E, the center transmission line 299 of the signal transmission structure may be encapsulated in dielectric material. Alternatively, rather than dielectric material (e.g. BCB), the center transmission line 299 can be surrounded by air. In a representative embodiment, the material selected for the dielectric wall 220 to encapsulate the center transmission line is benzocyclobutene (BCB) or similar dielectric material.

The dielectric material and the center transmission line 299 may each be considered elements of the integrated circuit package 200. The center transmission line 299 is surrounded by conductors at ground potential (i.e., a different potential) to build a transmission line. Both the conductor of the center transmission line 299 and the ground conductor (not shown in FIG. 2A) are connected to the corresponding conductors/potentials on the PCB as well as the integrated circuit by means of the lowest layers (210*a* and 211*a*), or wire bonds 230, respectively.

In the embodiment of FIGS. 2A to 2E, the dielectric wall 220 and the lid 288 seal the integrated circuit from exposure to external air. Though FIG. 2A does not illustrate layers of the integrated circuit package 200 other than the lowest layer 210*a*, the dielectric wall 220 may be provided between two such layers such as between a second layer 210*b* and a ninth layer 210*i*. The multiple layers of the integrated circuit package 200 are shown in FIGS. 2C, 2D and 2E. The dielectric wall 220 may seal a portion of the integrated circuit package that includes the integrated circuit. For example, the dielectric wall provides an environmental seal for the open space around the integrated circuit 290. The lid 288 seals the integrated circuit package 200 from the top. The dielectric wall 220 and the lid 288 may provide protection from environmental factors during assembly and operation of the integrated circuit package 200 and the integrated circuit.

The PCB conductors 204, 206 support the integrated circuit package 200 from the bottom. The PCB conductors 204, 206 may consist of a metal such as copper. The PCB conductors 204, 206 on the PCB 295 support the lowest layers 211*a* and 210*a* of the integrated circuit package 200. The lowest layers 211*a* and 210*a* of the integrated circuit package 200 may also be made of a metal such as copper. The PCB 295 may be attached to the integrated circuit package 200 by, for example, soldering.

An air cavity is provided around the integrated circuit. That is, in the embodiment of FIGS. 2A to 2E, the integrated circuit package 200 may include the air cavity around the integrated circuit. The air cavity is defined in part by the dielectric wall 220 and the lid 288 and can enhance high frequency performance for the integrated circuit as it seals the integrated circuit without significantly impacting its electrical performance.

The wire bonds 230, which illustratively comprise gold (Au) or similarly suitable electrical conductor, are provided from the center transmission line 299 and any ground planes in/on the integrated circuit package 200 to the integrated circuit and can be selectively matched to the electrical impedance of the integrated circuit and the integrated circuit package in advance of fabrication, for example, by means of compensating features in the package and/or on the IC.

A variety of factors for the integrated circuit package 200 contribute to the control of the electrical impedance path for the center transmission line 299. The shape of the first layer 211*a* and the second dielectric post 224 help offset parasitic capacitance and parasitic inductance respectively. For instance, the inductive wire bonds 230 can be compensated to match the electrical impedance of the integrated circuit and the center transmission line 299. Other aspects of the control of the electrical impedance path are explained below.

FIG. 2B is an equivalent electrical circuit diagram of an integrated circuit package transition between two signal transmission lines according to representative embodiments. As will be appreciated, various aspects of the components described in connection with FIG. 2B are described in more detail in connection with representative embodiments. The equivalent electrical circuit diagram of FIG. 2B is provided to provide a description of various elements used to compensate for parasitic components to ensure an adequate impedance match at each connection of the integrated circuit package 200 of various representative embodiments.

Turning to FIG. 2B, PCB center conductor 204 is connected to integrated circuit 290 via center transmission line 299. Notably, and as will become clearer as the present description continues, a parasitic capacitance at a solder pad of the PCB center conductor 204 at the connection of the PCB center conductor 204 to first layer 211*a* is compensated by necking down the PCB center conductor 204 prior to the connection of PCB center conductor 204 to first layer 211*a*, and necking down first layer 211*a* adjacent to second layer 211*b*.

Similarly, the capacitance provided by the second dielectric post 224 of the package and the RF bond pads 291 on the IC compensate the parasitic inductance caused by wire bonds 230

FIG. 2C illustrates a front perspective view of an integrated circuit package, according to representative embodiments.

In FIG. 2C, an integrated circuit package 200 includes several layers including a first layer 210*a*, a second layer 210*b*, a third layer 210*c*, a fourth layer 210*d*, a fifth layer 210*e*, a sixth layer 210*f*, a seventh layer 210*g*, an eighth layer 210*h*, and a ninth layer 210*i*. In accordance with a representative embodiment, the first layer 210*a* through the ninth layer 210*i* illustratively comprise a suitable electrical conductor, such as copper, gold, or aluminum. The integrated circuit package 200 consists of different layers with different geometries, such as different heights, widths or depths. The integrated circuit package 200 may be a QFN package, and the mechanical configuration of the different layers is used as one aspect of the compensation to provide a controlled electrical impedance path. As can be seen in FIG. 2C, the layers of the integrated circuit package 200 are not necessarily entirely aligned and may not have identical dimensions. Rather, the layers of the integrated circuit package 200 may have depths that vary from one another, widths that vary from one another, and lengths that vary from one another. For example, in FIG. 2C, the first layer 210*a* and the sixth layer 210*f* have depths (z-direction of the depicted coordinate system) greater than the depths of the second layer 210*b*, the third layer 210*c*, the fourth layer 210*d*, and the fifth layer 210*e*. Additionally, the first layer 210*a* has a width (y-direction of the depicted coordinate system) lower than the second layer 210*b* and other layers of the integrated circuit package 200. The varying dimensions of layers in FIG. 2C is only an example, and in other embodiments the dimensions of the layers may all be the same or may vary in ways different than that shown in FIG. 2C. Additionally, in other embodiments, integrated circuit package 200 may have a different number of layers than nine depicted in FIG.

2C. In embodiments herein, the layers of the integrated circuit package 200 are or may be maintained fully or partially through the transmission line structure, the first dielectric post 223 and the second dielectric post 224, even when the transmission line structure, the first dielectric post 223 and the second dielectric post 224 are separated by spaces therebetween.

In FIG. 2C, the first post 211 comprises a first layer 211a, a second layer 211b, a third layer 211c, a fourth layer 211d, and a fifth layer 211e, comprising the integrated package elements of the center transmission line 299. Notably, all layers of first post 211 (211a-211e) build a signal transmission line (e.g., a radio frequency (RF) signal transmission line), and 211e abuts dielectric strap 222 as shown.

As can be seen in FIG. 2C, the layers of the first post 211 are not necessarily entirely aligned and may not have identical dimensions. Rather, the layers of the first post 211 may have depths that vary from one another, widths that vary from one another, and lengths that vary from one another. For example, in FIG. 2C, the first layer 211a has a depth (vertical direction on the page) greater than the depths of the second layer 211b, the third layer 211c, and the fourth layer 211d. Additionally, the first layer 211a has a width (horizontal direction on the page) lower than the second layer 211b, the third layer 211c, and the fourth layer 211d. The varying dimensions of layers of the first post 211 in FIG. 2C is only an example, and in other embodiments the dimensions of the layers of the first post 211 may all be the same or may vary in ways different than that shown in FIG. 2C. Additionally, the first post 211 may have a different number of layers than four in some embodiments.

The integrated circuit package 200 also includes a first and second dielectricpost that are not shown in FIG. 2C. The first and second dielectric post are inside of the integrated circuit package 200 and thus the first and second dielectric post are hidden from view in FIG. 2C. The integrated circuit package 200 in FIG. 2C also includes a transmission line structure running from a PCB beneath the integrated circuit package 200 to an integrated circuit. The integrated circuit package 200 in FIG. 2C also includes wire bonds 230, which are depicted in FIG. 2D, and cannot be seen in FIG. 2C as they are on the opposing side of the integrated circuit package 200 from the first post 211. The first post 211 is provided towards a bond pad from the PCB 295. As shown in FIG. 2E, for example, the second dielectric post is provided towards the RF bond pad 291 from the integrated circuit. The first post 211 provides a necking of the transmission line structure to provide compensation for undesired capacitance resulting from connecting the printed circuit board. The second dielectric post provides a necking of the transmission line structure to provide compensation for undesired inductance resulting from connecting the integrated circuit package 200 to the IC 290 via wire bonds 230 or other conductive bonds. Notably, as noted above, the first layer 211a has a width (horizontal direction on the page) that is lower than the widths of second layer 211b, the third layer 211c, and the fourth layer 211d. This "necking" of the first layer 211a beneficially provides an inductive compensation for the parallel capacitance created by the RF bond pad 291 on the PCB 295. The center transmission line 299 of the integrated circuit package 200 in FIG. 2C is provided between adjacent ground planes and is sealed from exposure to air. Notably, to protect the internal contents of the integrated circuit package, dielectric wall 220 could be foregone in favor of other sealing and coating methods and materials such as described below. As such, the metallic, conductive center transmission line 299 does not necessarily require sealing or coating.

Additionally, the center transmission line 299 may also be sealed by a sealant such as an epoxy or even a coating that seals the center transmission line 299. For example, the integrated circuit package 200 may include a coating around the center transmission line 299 that seals the center transmission line 299 from exposure to air. As an example, a commercially available coating such as "Signal Seal" from GVD Ultrathin Polymer Coatings Corporation (USA) may be used in place of or in addition to the dielectric wall 220. Such coatings may have dielectric properties that can impact the performance of the integrated circuit but can be applied as a thin layer such that the overall impact to the performance of the integrated circuit is negligible. Notably, the coating around the center transmission line 299 is thin yet maintains mechanical integrity, and has a low dielectric constant to minimize impact on electrical property of transmission line. Illustratively, the coating around the center transmission line 299 has a dielectric constant of approximately 3.0, and a thickness of approximately 15.0 μm.

As will become clearer from the description of FIG. 2D, the wire bonds 230 of the integrated circuit package 200 in FIG. 2C connect the transmission line structure comprising center transmission line 299 to pads on the integrated circuit from where the center transmission line 299 exits the integrated circuit package 200. The wire bonds 230 ideally have substantially the same characteristic impedance as the input impedance of the integrated circuit 290 and the characteristic impedance of the center transmission line 299. If that is not possible the impedance mismatch should be compensated, ideally, simultaneously in the integrated circuit package and on the IC.

The first post 211 is part of the center transmission line 299 where the center transmission line 299 enters the integrated circuit package 200 from the printed circuit board. As shown more clearly in FIG. 2E, the second dielectric post is comprised of fourth layer 211d, second dielectric post 224, and the second layer 210b of the integrated circuit package 200. The second dielectric post 224 supports the center transmission line 299, where the center transmission line 299 exits the integrated circuit package 200 to connect to the wire bonds 230. The second dielectric post 224 and the RF bond pads 291 compensate for the parasitic inductance of the wire bonds 230.

The integrated circuit package 200 in FIG. 2C includes several dielectric layers that serve a variety of purposes. A dielectric strap 222 positions and maintains the location of the first post 211 in what would otherwise be open space in the fifth layer 210e of the integrated circuit package 200. That is, the first dielectric post 222 comprises a dielectric material that holds the first post 211 in position. In various embodiments, the dielectric materials such as the first dielectric layer 222 can function as a strap that supports the center transmission line 299. By contrast, and as noted above, unlike dielectric wall 220, the first dielectric layer 222 is not used to seal the inside of the integrated circuit package 200 from the outside of the integrated circuit package 200. The sealing of the inside of the integrated circuit package 200 may prevent air and moisture from entering and interfering with functionality such as high frequency signaling. Notably, the PCB center conductor 204 and the PCB ground conductor 206 physically terminate at first layer 211a and 210ab, and are thus not components of the integrated circuit package 200. Generally, the conductors are part of the PCB to which the integrated circuit package 200 is attached. The first section and the second section are typically copper, with the dielectric of the PCB 295 disposed as shown.

The construction of the PCB in the embodiment of FIGS. 2A to 2E can contribute to the performance of the integrated circuit package 200. For example, materials used for high frequency PCB construction may have a low dielectric loss and a low dielectric constant. By way of illustration, the PCB may comprise commercially available Tachyon100G® having a dielectric constant of ~3.1, and a dielectric loss of ~0.002. Notably, the use of this material is merely illustrative, and other materials having similar dielectric constants and dielectric losses are contemplated. Beneficially, the use of low dielectric loss materials in the signal transmission lines of the present teachings may reduce the losses in microstrip and stripline transmission lines in the PCB where loss is directly proportional to frequency. Low dielectric constant materials foster fabrication of the integrated circuit package 200 with a center transmission line 299 having low conductive losses with resonant free performance. Commercially available materials for the PCB which have these properties include Tachyon 100G from Isola group and EZIO from Taconic.

FIG. 2D illustrates a rear perspective view of the integrated circuit package in FIG. 2C, according to a representative embodiment.

In FIG. 2D, the integrated circuit package 200 includes some or all of the same layers shown from the front perspective view in FIG. 2C, including the first layer 210a, the second layer 210b, the third layer 210c, the fourth layer 210d, and the fifth layer 210e. The wire bonds 230 connecting the center transmission line 299 and adjacent ground planes of the transmission line structure to the RF bond pads 291 on the integrated circuit are also included in the integrated circuit package 200.

As shown, the center two wired bonds of wire bonds 230 are connected to the fourth layer 211d, which is one of the layers of the second dielectric post 224.

The first post 211 and the fourth layer 211d may be fabricated at the same time and in the same process as the remainder of the integrated circuit package 200. For example, each of the layers may be deposited together and then selectively isolated from one another by etching or an analogous process. In an embodiment, the center transmission line 299 and its adjacent coaxial ground path provided by first to seventh layers 210a-210g are brought close to the integrated circuit package 200 to enable wirebonding.

FIG. 2E illustrates a side perspective view of the integrated circuit package in FIGS. 2A and 2C, according to a representative embodiment.

In FIG. 2E, portions of several layers of the integrated circuit package 200 are removed to show elements in the interior of the integrated circuit package 200. On the left side in FIG. 2E, nine layers are shown including the first layer 210a, the second layer 210b, the third layer 210c, the fourth layer 210d, the fifth layer 210e, the sixth layer 210f, the seventh layer 210g, the eighth layer 210h, and the ninth layer 210i. Additionally, the four layers of the first post 211 are shown, including the first layer 211a, the second layer 211b, the third layer 211c, and the fourth layer 211d. Wire bonds 230 are shown on the upper right connecting to the RF bond pads 291 of the integrated circuit 290.

In FIG. 2E, the second dielectric post is shown beneath the left side of the wire bonds 230. The second dielectric post comprises the right side of the fourth layer 211d, and a second dielectric post 224, which is disposed over the second layer 210b of the integrated circuit package 200.

In the integrated circuit package 200 shown in FIGS. 2A, 2C and 2D, center transmission line 299 is sealed, and runs through the transmission line structure that also includes adjacent ground planes. The sealed transmission line is sealed by a dielectric wall 220 as an environmental seal. The dielectric wall 220 seals the integrated circuit, wire bonds 230, and elements in the open space on the right from exposure to the environment surrounding integrated circuit package 200. Notably, lid 288 is not shown in FIGS. 2C-2E, but can be provided as a top of the integrated circuit package 200 to complete the sealing of the open space on the right from exposure to air. That is, in the embodiment of FIGS. 2A to 2E, the integrated circuit package 200 may include the lid 288 that seals the integrated circuit package 200. Beneficially, the lid 288 comprises the same material as the integrated circuit package 200 to provide a suitable match of their respective coefficients of thermal expansion (CTE).

Therefore, at least a portion of the transmission line structure is sealed from exposure to the environment surrounding integrated circuit package 200. The dielectric wall 220 also provides a seal for the cavity around the integrated circuit, though the dielectric wall 220 may be supplemented or replaced by an alternative without drawbacks of potting.

Additionally, the center transmission line 299 in the transmission line structure may be sealed with a sealant that seals the center transmission line 299. Sealants, such as described above, may also be used to seal the ground metal surrounding the center transmission line. In the integrated circuit package 200 of the present embodiment, the center transmission line 299, consisting entirely of layers 211a-e, runs from PCB center conductor 204 on the left in FIG. 2E to the wire bonds 230 on the right. The signals on the center transmission line 299 ultimately run to and from the integrated circuit 290. The structure and materials of the integrated circuit package 200 in the embodiment of FIGS. 2A to 2E compensate for capacitance and inductance added by a variety of sources. Beneficially, therefore, the integrated circuit package 200 compensates for factors that otherwise hinder the consistency of the electrical impedance along the signal path. For example, capacitance from soldering of the integrated circuit package 200 to the printed circuit board 295 is compensated. Additionally, the transition from the PCB center conductor 204 into the center transmission line 299 may play a significant role in performance at high frequencies. In the embodiment of FIGS. 2A to 2E, the integrated circuit package 200 compensates, for example, for the capacitance of the solder pad on the PCB necessary to solder the integrated circuit package 200 to the printed circuit board and for the inductance of wirebonds connecting the integrated circuit to the center transmission line 299. The necking of the transmission line and the capacitance provided by the second dielectric post of the integrated circuit package 200 are two aspects of the electrical impedance control of a controlled electrical impedance path from the printed circuit board to the integrated circuit in the embodiment of FIGS. 2A to 2E.

Although the embodiments of FIG. 2A to 2E show the integrated circuit package 200 being used to package a single integrated circuit, the teachings for an integrated circuit package herein can also be used to package more than one integrated circuit in a single integrated circuit package. Moreover, tightly controlled transmission line structures as described herein can also be used to interface multiple integrated circuits, and not just an integrated circuit to a printed circuit board. That is, a transmission line package may alternatively include a transmission line structure running from a first integrated circuit to a second integrated circuit, while still including center transmission line 299 and sealed from exposure to air by an environmental seal.

The design of the integrated circuit package 200 in FIGS. 2A to 2E can be fabricated while still maintaining control of the electrical impedance of the transmission line assembly. As a result, an integrated circuit package 200 can be manufactured like the PCB 295 and the integrated circuit in mass production with available manufacturing methods. The fabrication of the disclosure can be accomplished by a variety of currently available fabrication techniques including conventional machining as well as microfabrication techniques. For example, using conventional machining, the dielectric materials and layers can be provided separately from the metal trace, and they can be assembled and glued into place such as by using a keying feature to properly place the assembly. Alternatively, using microfabrication, the metal trace and dielectric materials and layers can be selectively co-deposited in a progressive process as is understood in the electronics field.

Figure 3:
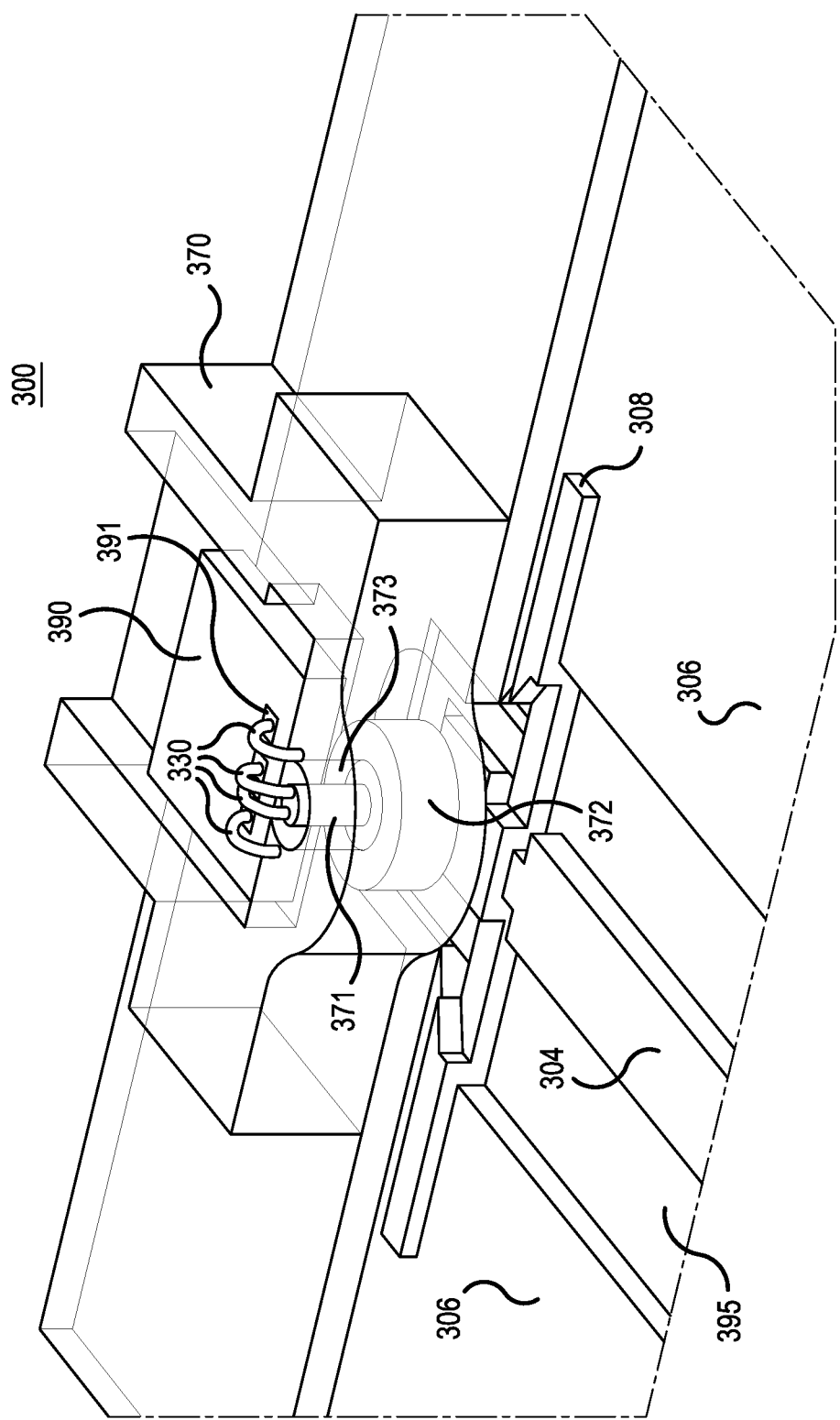
FIG. 3 illustrates a front perspective of another integrated circuit package transition, according to representative embodiments.

FIG. 3 illustrates a front perspective of another integrated circuit package, according to representative embodiments.

In FIG. 3, an integrated circuit package 300 includes 370, and is adjacent to PCB 395 comprised of sections 304, 306 and 308. A coaxial transmission structure 372 includes a center conductor 371 and an outer insulating layer 373. The integrated circuit is supported by the integrated circuit package body ground 370.

In the embodiment of FIG. 3, electrical impedance control from the PCB to the integrated circuit is accomplished via the coaxial transmission structure 372, as compared to a stripline structure as shown in the embodiment of FIGS. 2A to 2E. The embodiment of FIG. 3 illustrates that the teachings herein are independent of the geometry of the center transmission line 299 and ground planes. The integrated circuit package 300 in FIG. 3 is also enclosed by a separate lid (not shown) to seal the integrated circuit package 300, though the lid is again removed from the figure for clarity.

In FIG. 3, two of the wire bonds 330 are shown connecting to the center conductor 371, and two of the wire bonds 330 are connected to integrated circuit package body ground 370 adjacent to outer insulating layer 373. In the embodiment of FIG. 3, the capacitance and inductance being offset by the integrated circuit package 300 is again the capacitance of bond pads connecting the PCB to the integrated circuit package 300, and inductance of the wire bonds 330 connecting the center conductor 371 and ground of the integrated circuit package i.e. the transmission line to the pond pads 391 of the integrated circuit.

As described above, in the embodiment of FIG. 3, the transmission line structure implemented by the integrated circuit package 300 includes a coaxial transmission line. Multiple wire bonds 330 connect the center conductor 371 of the coaxial transmission structure 372 to the integrated circuit.

Figure 4:
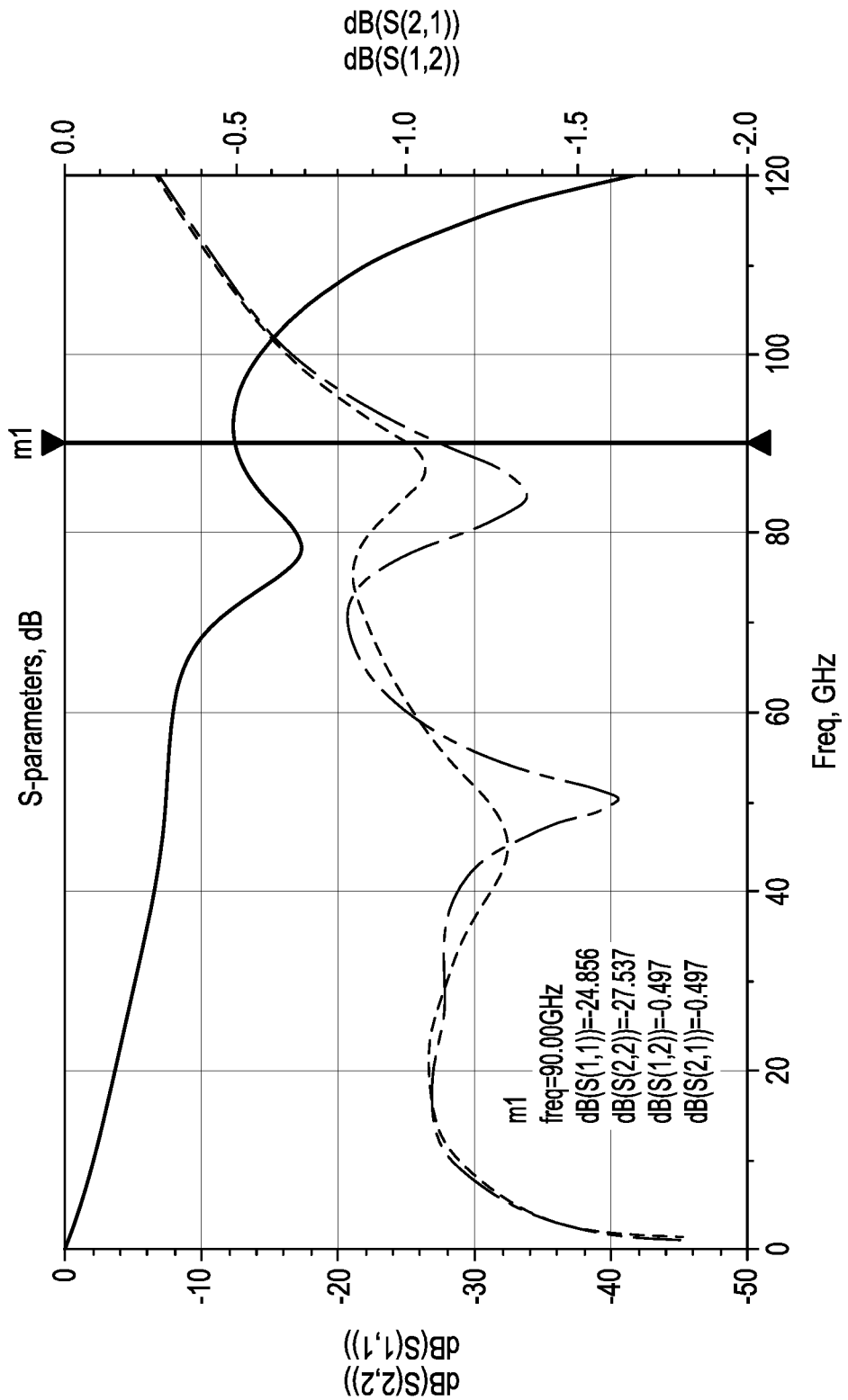
FIG. 4 illustrates a plot of return loss and insertion loss for the integrated circuit package transition in FIGS. 2A, 2D and 2E, according to representative embodiments.

FIG. 4 illustrates a plot of return loss and insertion loss for the integrated circuit package in FIGS. 2A, 2C, 2D and 2E, according to representative embodiments.

In FIG. 4, the simulated performance of the embodiment of FIGS. 2A to 2E is shown by the return loss (i.e. S(1,1), S(2,2)) as well as insertion loss (i.e. S(1,2), S(2,1)). In FIG. 4, the plot shows effective matching up to 100 GHz. The line starting from the 0,0 origin and trending down towards the right shows a simulated deviation from not closing the lid 288 in the embodiment in FIG. 2A in the plot of FIG. 4. If the lid 288 were provided, the impedance matching between the two dashed lines would be closer in FIG. 4. In FIG. 4, energy is being radiated due to the missing lid 288. S(1,1) and S(2,2) are less than −20 dB almost up to 100 GHz, which means they are effectively matched, and this electrical impedance matching is not achieved with current QFN technology.

Inasmuch as an RF transition is often considered suitable for use with a return loss better than 15 dB, the results in FIG. 4 show that the embodiment of FIG. 2A to 2E is usable to 100 GHz. As shown in FIG. 4, the integrated circuit package 200 of the embodiment of FIGS. 2A to 2E maintains electrical impedance from the printed circuit board 295 to the integrated circuit 290 such that return loss of the integrated circuit package is better than 15 dB up to 100 GHz.

As described above, an integrated circuit package according to the present disclosure provides tight control of the electrical impedance of the transition from the PCB to the integrated circuit. High frequency performance of the transmission line structure can be improved by controlling the electrical impedance, and the improvement can be enhanced by minimizing the length of the wire bonds 230, 330, such as placing leads of the center transmission line 299 as close to the integrated circuit as possible. In the embodiment of FIGS. 2A to 2E, this can be accomplished in two ways: either by extending the transmission line structure of the integrated circuit package close to the RF bond pads 291 on the integrated circuit or by selectively sizing the overall integrated circuit package based on the electrical characteristics (e.g., electrical impedance) of the integrated circuit. These methods may be used either separately or in combination.

Accordingly, the integrated circuit packages described herein provide electrical impedance matching, such as with the wire bonds 230, 330, along with an air cavity sealed by an environmental seal such as dielectric wall 220. These features and others are provided by a comprehensive design that maximizes the electrical impedance matching for the transmission line structure such as to 50 Ohms up to 100 GHz. The integrated circuit packages described herein can be sealed for environmental performance without degrading the electrical performance of the integrated circuit. Additionally, as described herein the PCB that supports the integrated circuit package can be designed with materials that support high frequency operations of the integrated circuit. And, as explained above, the signal lead and ground planes from the integrated circuit package can be extended to the integrated circuit in order to optimize high frequency performance.

Although high-performance integrated circuit packaging platform compatible with surface mount assembly has been described with reference to several exemplary embodiments, it is understood that the words that have been used are words of description and illustration, rather than words of limitation. Changes may be made within the purview of the appended claims, as presently stated and as amended, without departing from the scope and spirit of high-performance integrated circuit packaging platform compatible with surface mount assembly in its aspects.

Although high-performance integrated circuit packaging platform compatible with surface mount assembly has been described with reference to particular means, materials and embodiments, high-performance integrated circuit packaging platform compatible with surface mount assembly is not intended to be limited to the particulars disclosed; rather high-performance integrated circuit packaging platform compatible with surface mount assembly extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. An integrated circuit package, comprising:
a transmission line structure running from a printed circuit board (PCB) to an integrated circuit (IC) and including a center transmission line between adjacent ground planes and sealed from exposure to air;
conductive bonds that connect the transmission line structure to pads on the integrated circuit from where the center transmission line exits the integrated circuit package;
a post that is part of the center transmission line where the center transmission line enters the integrated circuit package from the printed circuit board; and
a dielectric post that supports the center transmission line where the center transmission line exits the integrated circuit package to connect to the conductive bonds, wherein the dielectric post provides compensating capacitance for inductance of the conductive bonds connecting the transmission line structure to the integrated circuit.

2. The integrated circuit package of claim 1, wherein the center transmission line of the transmission line structure is encapsulated in dielectric material.

3. The integrated circuit package of claim 1, further comprising:
an air cavity around the integrated circuit and RF pads of the integrated circuit.

4. The integrated circuit package of claim 1, further comprising:
a dielectric wall through which the center transmission line passes, which seals the integrated circuit from exposure to air and which supports the center transmission line between the post and the dielectric post.

5. The integrated circuit package of claim 1, further comprising:
a lid that seals the integrated circuit package.

6. The integrated circuit package of claim 1, wherein the integrated circuit package maintains electrical impedance from the printed circuit board to the integrated circuit such that return loss of the integrated circuit package is better than 15 dB performance from DC to beyond 100 GHz.

7. The integrated circuit package of claim 1, wherein the integrated circuit package compensates for capacitance from soldering of the integrated circuit package to the printed circuit board.

8. The integrated circuit package of claim 1, wherein the integrated circuit package comprises a plurality of layers that are maintained through the transmission line structure, the post and the dielectric post.

9. The integrated circuit package of claim 1, further comprising:
dielectric material that holds the post in position.

10. The integrated circuit package of claim 1, wherein the transmission line structure comprises a coaxial transmission line, wherein a plurality of the conductive bonds each connect a center conductor or a ground conductor of the coaxial transmission line to the integrated circuit.

11. The integrated circuit package of claim 1, wherein the integrated circuit package provides a controlled electrical impedance path from the printed circuit board to the integrated circuit.

12. The integrated circuit package of claim 1, wherein adjacent ground planes are extended to end proximate to the integrated circuit.

13. An integrated circuit package, comprising:
a transmission line structure running from a printed circuit board (PCB) to an integrated circuit (IC) and including a center transmission line between adjacent ground planes and sealed from exposure to air;

conductive bonds that connect the transmission line structure to pads on the integrated circuit from where the center transmission line exits the integrated circuit package;

a post that is part of the center transmission line where the center transmission line enters the integrated circuit package from the printed circuit board; and a dielectric post that supports the center transmission line where the center transmission line exits the integrated circuit package to connect to the conductive bonds, wherein the post and the dielectric post provide a necking of the transmission line structure to provide compensation for capacitance and inductance resulting from connecting the printed circuit board and the integrated circuit to the integrated circuit package, respectively.

14. The integrated circuit package of claim 13, wherein the center transmission line of the transmission line structure is encapsulated in dielectric material.

15. The integrated circuit package of claim 13, further comprising:

an air cavity around the integrated circuit and RF pads of the integrated circuit.

16. The integrated circuit package of claim 13, further comprising:

a dielectric wall through which the center transmission line passes, which seals the integrated circuit from exposure to air and which supports the center transmission line between the post and the dielectric post.

17. The integrated circuit package of claim 13, further comprising:

a lid that seals the integrated circuit package.

* * * * *